(12) United States Patent
Luo et al.

(10) Patent No.: US 12,058,884 B2
(45) Date of Patent: Aug. 6, 2024

(54) DISPLAY PANEL AND DISPLAY DEVICE

(71) Applicant: SEEYA OPTRONICS CO., LTD., Shanghai (CN)

(72) Inventors: Liyuan Luo, Shanghai (CN); Run Yang, Shanghai (CN)

(73) Assignee: SeeYA Optronics Co., Ltd., Shanghai (CN)

(*) Notice: Subject to any disclaimer, the term of this patent is extended or adjusted under 35 U.S.C. 154(b) by 427 days.

(21) Appl. No.: 17/404,949

(22) Filed: Aug. 17, 2021

(65) Prior Publication Data

US 2022/0209197 A1    Jun. 30, 2022

(30) Foreign Application Priority Data

Dec. 29, 2020 (CN) .......................... 202011592761.2

(51) Int. Cl.
*H10K 50/858* (2023.01)
*H10K 59/38* (2023.01)

(52) U.S. Cl.
CPC ........... *H10K 50/858* (2023.02); *H10K 59/38* (2023.02)

(58) Field of Classification Search
CPC .... H10K 50/858; H10K 59/38; H10K 59/121; H10K 59/10; H10K 59/879; G02B 3/0006; G02B 27/017; G02B 27/0172
See application file for complete search history.

(56) References Cited

U.S. PATENT DOCUMENTS

| | | | |
|---|---|---|---|
| 2019/0064526 A1* | 2/2019 | Connor | G02B 6/0073 |
| 2019/0103587 A1* | 4/2019 | Lee | H10K 50/854 |
| 2021/0149212 A1* | 5/2021 | Benítez | G02B 30/10 |
| 2022/0006058 A1* | 1/2022 | Huang | H10K 50/813 |
| 2022/0128742 A1* | 4/2022 | Ikeda | G02B 27/48 |

FOREIGN PATENT DOCUMENTS

| | | |
|---|---|---|
| CN | 107688243 A | 2/2018 |
| CN | 109841757 A | 6/2019 |
| CN | 110045539 A | 7/2019 |
| CN | 110534664 A | 12/2019 |
| CN | 111063706 A | 4/2020 |
| CN | 111682122 A | 9/2020 |
| JP | 2010-123436 A | 6/2010 |
| TW | 1688119 B | 3/2020 |

OTHER PUBLICATIONS

Chinese Office Action dated Feb. 14, 2022, in connection with Chinese Application No. 202011592761.2.

* cited by examiner

*Primary Examiner* — Yasser A Abdelaziz
(74) *Attorney, Agent, or Firm* — Wolf, Greenfield & Sacks, P.C.

(57) ABSTRACT

Provided are a display panel and display device. The geometric center of the display region in the display panel is configured as a first center. Circles centered at the first center are configured as first circles. Along a direction in which a radius of any one of the first circles points away from the first center, the offsets of the geometric centers of multiple color filters relative to the light-emitting centers of multiple light-emitting elements and away from the first center increase gradually, and the volumes of multiple micro-lenses increase gradually.

11 Claims, 8 Drawing Sheets

DISPLAY PANEL AND DISPLAY DEVICE

CROSS-REFERENCE TO RELATED APPLICATION(S)

Foreign priority benefits are claimed under 35 U.S.C. § 119(a)-(d) or 35 U.S.C. § 365(b) of Chinese application number 202011592761.2, filed Dec. 29, 2020, the disclosure of which is incorporated herein by reference in its entirety.

TECHNICAL FIELD

Embodiments of the present disclosure relate to the field of display technology and, in particular, to a display panel and a display device.

BACKGROUND

Virtual reality (VR) technology, also known as virtual environment, spiritual environment, or artificial environment, refers to a technology through which a virtual world is created by computers. The virtual reality technology applies visual, auditory, and tactile senses directly to participants and enables the participants to observe and operate interactively. Augmented reality (AR) technology is a new technology that integrates the information of the real world and the information of a virtual world seamlessly by calculating the positions and angles of images captured by cameras and adding corresponding images. The object of the augmented reality technology is to superimpose a virtual world to the real world and implement interactions.

As for a current virtual-reality display device or an augmented-reality display device, a disadvantage lies in a poor luminance uniformity in the display region. The closer to the center of the display region, the greater the luminance.

SUMMARY

The present disclosure provides a display panel and a display device to improve the luminance uniformity in the display region of the display device.

In a first aspect, embodiments of the present disclosure provide a display panel.

The display panel includes a substrate, a plurality of light-emitting elements disposed on the substrate, a plurality of color filters disposed on the substrate, and a plurality of micro-lenses disposed on the substrate.

The color filters are in one-to-one correspondence with the light-emitting elements. Each color filter is disposed on the light extraction side of a respective light-emitting element corresponding to the each color filter.

The micro-lenses are in one-to-one correspondence with the color filters. Each micro-lens is disposed on one side of a respective color filter corresponding to the micro-lens facing away from the light-emitting elements. A line connecting the geometric center of the micro-lens and the geometric center of the color filter corresponding to the micro-lens is perpendicular to the plane in which the substrate is located.

The display panel includes a display region. The light-emitting elements are disposed in the display region. The geometric center of the display region is configured as a first center. Circles centered at the first center are configured as first circles. Along a direction in which a radius of any one of the first circles points away from the first center, the offsets of the geometric centers of multiple color filters relative to the light-emitting centers of multiple light-emitting elements increase gradually on one side of the plurality of light-emitting elements facing away from the first center, and the volumes of multiple micro-lenses increase gradually.

In a second aspect, embodiments of the present disclosure further provide a display device. The display device includes the display panel in the preceding first aspect.

The geometric center of the display region of the display panel provided in embodiments of the present disclosure is configured as the first center. Circles centered at the first center are configured as first circles. Along a direction in which a radius of any one of the first circles points away from the first center, the offsets of the geometric centers of multiple color filters relative to the light-emitting centers of multiple light-emitting elements increase gradually on one side of the plurality of light-emitting elements facing away from the first center, and the volumes of multiple micro-lenses increase gradually. With this arrangement, along the direction in which a radius of any one of the first circles points away from the first center, the effect of increasing luminance strengthens gradually, thus compensating for the luminance difference in the direction and improving the luminance uniformity in the display region of the display device.

BRIEF DESCRIPTION OF DRAWINGS

Other features, objects and advantages of the present disclosure become more apparent from a detailed description of non-limiting embodiments with reference to the drawings.

DETAILED DESCRIPTION

Figure 1:
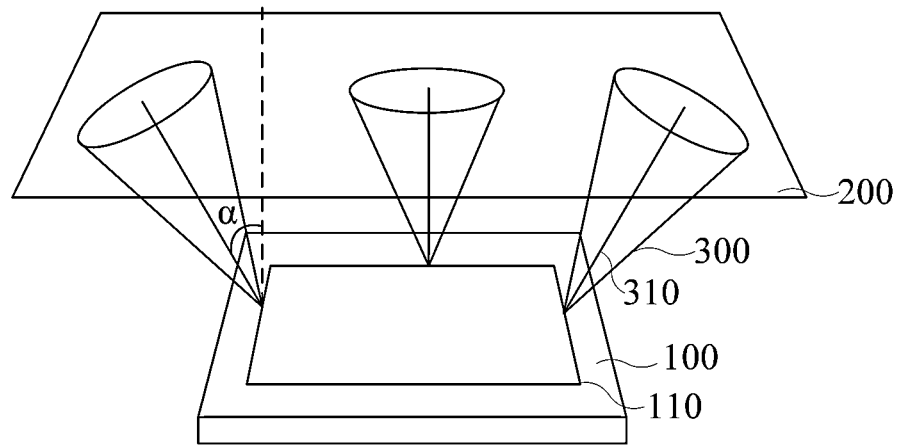
FIG. 1 is a diagram illustrating the structure of a virtual-reality display device or an augmented-reality display device in the related art.

To further elucidate technical means and effects for achieving intended objects of the present disclosure, implementations, structures, features and effects of a display panel and a display device according to the present disclosure are described hereinafter in detail in conjunction with the drawings and preferred embodiments.

Embodiments of the present disclosure provide a display panel.

The display panel includes a substrate, a plurality of light-emitting elements, a plurality of color filters and a plurality of micro-lenses disposed on the substrate.

The color filters are in one-to-one correspondence with the light-emitting elements. Each color filter is disposed on the light extraction side of a respective light-emitting element corresponding to the color filter.

The micro-lenses are in one-to-one correspondence with the color filters. Each micro-lens is disposed on one side of a respective color filter corresponding to the micro-lens facing away from the light-emitting elements. A line connecting the geometric center of the micro-lens and the geometric center of the color filter corresponding to the micro-lens is perpendicular to the plane in which the substrate is located.

The display panel includes a display region. The light-emitting elements are disposed in the display region. The geometric center of the display region is configured as a first center. Circles centered at the first center are configured as first circles. Along a direction in which a radius of any one of the first circles points away from the first center, the offsets of the geometric centers of multiple color filters relative to the light-emitting centers of multiple light-emitting elements increase gradually on one side of the plurality of light-emitting elements facing away from the first center, and the volumes of multiple micro-lenses increase gradually.

The geometric center of the display region of the display panel provided in embodiments of the present disclosure is configured as the first center. Circles centered at the first center are configured as first circles. Along a direction in which a radius of any one of the first circles points away from the first center, the offsets of the geometric centers of multiple color filters relative to the light-emitting centers of multiple light-emitting elements increase gradually on one side of the plurality of light-emitting elements facing away from the first center, and the volumes of multiple micro-lenses increase gradually. With this arrangement, along the direction in which a radius of any one of the first circles points away from the first center, the effect of increasing luminance strengthens gradually, thus compensating for the luminance difference in the direction and improving the luminance uniformity in the display region of the display device.

The preceding is the core idea of the present disclosure. Technical solutions in embodiments of the present disclosure are described clearly and completely below in conjunction with the drawings of the present disclosure. Apparently, the embodiments described below are part, not all, of embodiments of the present disclosure. Based on embodiments of the present disclosure, all other embodiments obtained by those of ordinary skill in the art without creative work are within the scope of the present disclosure.

Details are set forth below to facilitate a thorough understanding of the present disclosure. However, the present disclosure may be implemented by other embodiments different from the embodiments described herein, and those skilled in the art may make similar generalizations without departing from the intension of the present disclosure. Therefore, the present disclosure is not limited to the embodiments below.

Additionally, the present disclosure is described in detail in conjunction with the drawings. In the detailed description of embodiments of the present disclosure, for ease of description, schematic views illustrating structures of devices and components are not partially enlarged to a general proportional scale. The schematic views are merely illustrative and are not intended to limit the scope of the present disclosure. Additionally, actual manufacturing includes three-dimensional spatial sizes: length, width and height.

FIG. 1 is a diagram illustrating the structure of a virtual-reality display device or an augmented-reality display device in the related art. As shown in FIG. 1, the virtual-reality display device or the augmented-reality display device includes a display panel 100 and an optical lens 200 disposed on the light extraction side of the display panel 100. The optical lens 200 is configured to collect the light emitted from the display panel 100.

It is to be noted that in a light beam 300 emitted from a specific region of the display panel 100, the light at the main optical axis 310 of the light beam has the greatest luminance. The display panel 100 includes a display region 110. Along the direction in which the geometric center of the display region 110 points away from the geometric center, angles of the main optical axes 310 increase progressively, and the light at the main optical axes 310 decreases progressively, generating the non-uniform luminance of the display region 110. The angle of a main optical axis 310 refers to an included angle α between the main optical axis 310 and a perpendicular line of the plane in which the display panel 100 is located.

Figure 2:
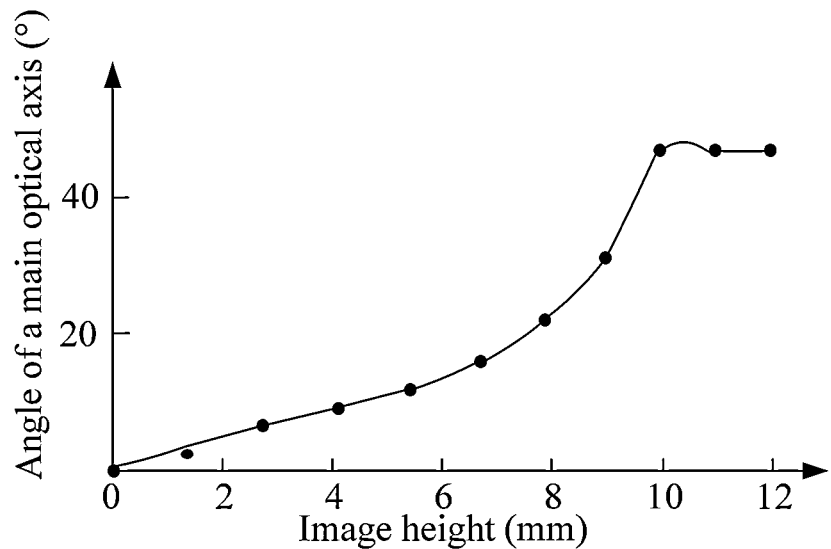
FIG. 2 plots a fitted curve illustrating those angles of main optical axes vary with image heights.

Specifically, Table 1 describes the correspondence between image heights and angles of a main optical axis. By taking the geometric center of the display region 110 as the center, the image height is a distance from a point in the display region 110 to the center. FIG. 2 plots a fitted curve illustrating those angles of a main optical axis vary with image heights. As shown in Table 1 and FIG. 2, as the distances between light-emitting points and the center of the display region of the display panel increase, the angles of main optical axes of light beams emitted from light-emitting points increase gradually. Moreover, based on the fitting results shown in FIG. 2, it is obtained that the angle y of a main optical axis and the image height x satisfy the following relationship: $y=0.0019x^5-0.0337x^4+0.2468x^3-0.8528x^2+3.3211x$. The angle y of a main optical axis is an angle at which a main optical axis deviates from a first direction. The, first direction is perpendicular to the plane in which the display panel is located.

TABLE 1

| Image Height | Angle of Main Optical Axis |
| --- | --- |
| 0 | 0 |
| 1.37 | 3.3604 |
| 2.74 | 6.2558 |

TABLE 1-continued

| Image Height | Angle of Main Optical Axis |
|---|---|
| 4.10 | 8.9459 |
| 5.43 | 11.8702 |
| 6.70 | 15.7961 |
| 7.90 | 21.7842 |
| 9.00 | 31.1674 |
| 9.99 | 46.7999 |

Figure 3:
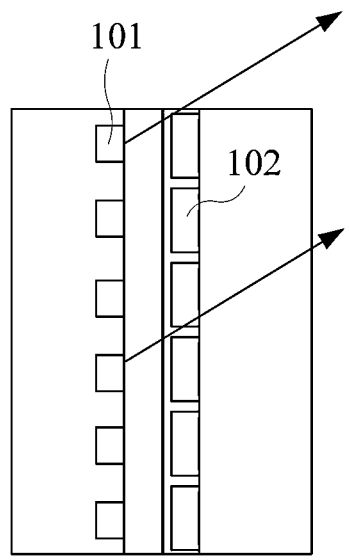
FIG. 3 is a sectional view illustrating the structure of a display panel according to embodiments of the present disclosure.
Figure 4:
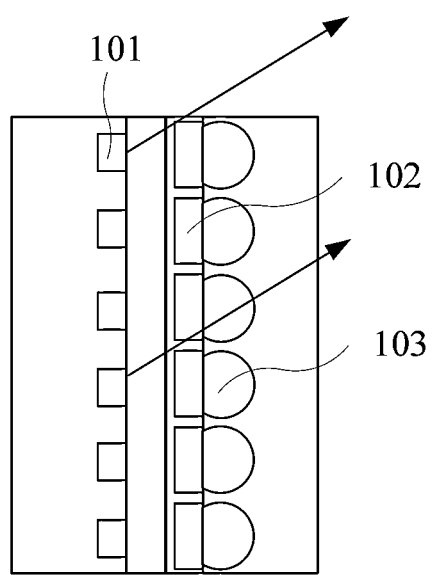
FIG. 4 is a sectional view illustrating the structure of another display panel according to embodiments of the present disclosure.

In the related art, the angles of main optical axes are adjusted through two manners. The first one is to change the transmission direction of light by controlling the misalignment of color filters 102 with light-emitting elements 101, as shown in FIG. 3. The second one is to change the transmission direction of light by controlling the misalignment of micro-lenses 103 and color filters 102 with light-emitting elements 101, as shown in FIG. 4.

Figure 5:
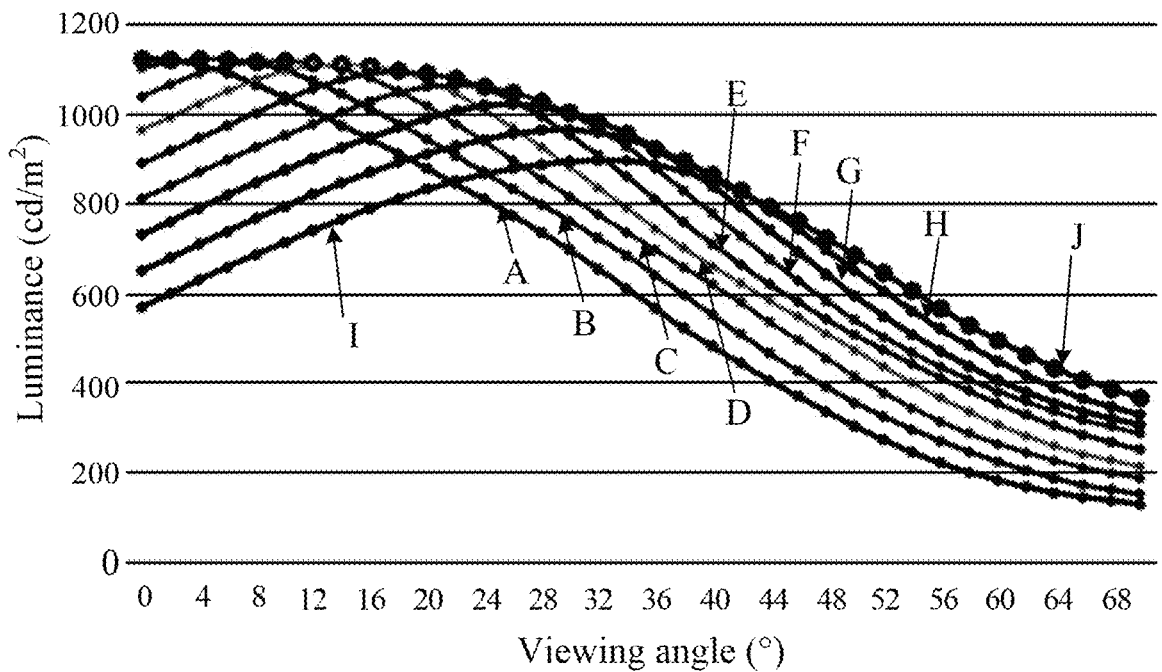
FIG. 5 plots curves of luminance against viewing angle by testing the display panel of FIG. 3.
Figure 6:
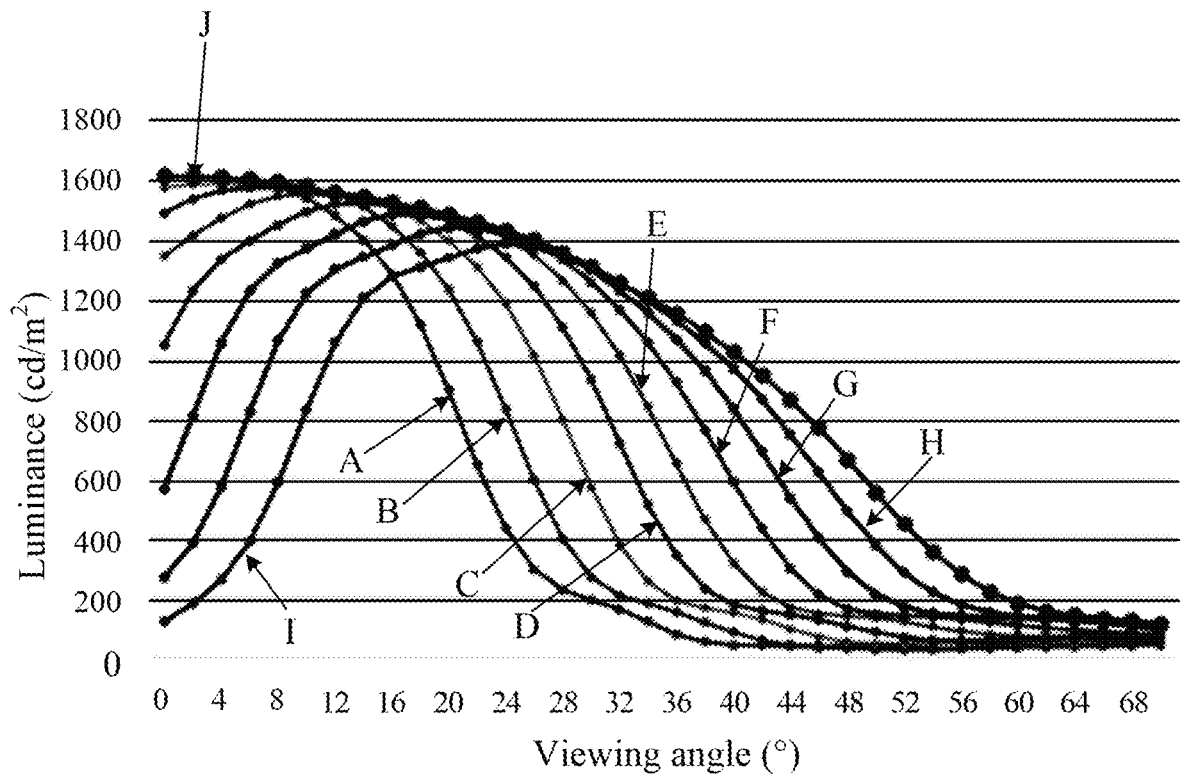
FIG. 6 plots curves of luminance against viewing angle by testing the display panel of FIG. 4.

Correspondingly, FIG. 5 plots curves of luminance against viewing angle, the graph being obtained by testing the display panel of FIG. 3. FIG. 6 plots curves of luminance against viewing angle by testing the display panel of FIG. 4. In FIGS. 5 and 6, curve A illustrates that the luminance varies with viewing angles when the offset of a color filter relative to a light-emitting element is zero. Curve B illustrates that the luminance varies with viewing angles when the offset amount of a color filter relative to a light-emitting element is 0.2. Curve C illustrates that the luminance varies with viewing angles when the offset of a color filter relative to a light-emitting element is 0.4. Curve D illustrates that the luminance varies with viewing angles when the offset of a color filter relative to a light-emitting element is 0.6. Curve E illustrates that the luminance varies with viewing angles when the offset of a color filter relative to a light-emitting element is 0.8. Curve F illustrates that the luminance varies with viewing angles when the offset of a color filter relative to a light-emitting element is 1.0. Curve G illustrates that the luminance varies with viewing angles when the offset of a color filter relative to a light-emitting element is 1.2. Curve H illustrates that the luminance varies with viewing angles when the offset of a color filter relative to a light-emitting element is 1.4. Curve I illustrates that the luminance varies with viewing angles when the offset of a color filter relative to a light-emitting element is 1.6. Curve J illustrates that the maximum luminance varies with viewing angles according to different offsets of the color filters relative to the light-emitting elements. It is to be understood that curve J is acquired through curves A to I. This embodiment mainly focuses on curve J since curve J essentially illustrates that the luminance of the main optical axes varies with viewing angles. Referring to curve J, as the viewing angles increase, the luminance of the main optical axes decreases gradually, resulting in poor luminance uniformity of the display panel.

Figure 7:
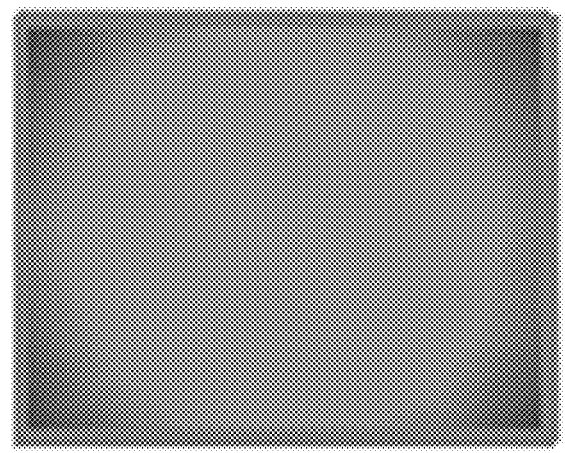
FIG. 7 is a diagram illustrating the luminance distribution of a display according to embodiments of the present disclosure.

FIG. 7 is a diagram illustrating the luminance distribution of a display panel according to embodiments of the present disclosure. As shown in FIG. 7, the luminance of the display panel decreases gradually from the center to the edges. The luminance uniformity of the display panel is relatively poor.

Figure 8:
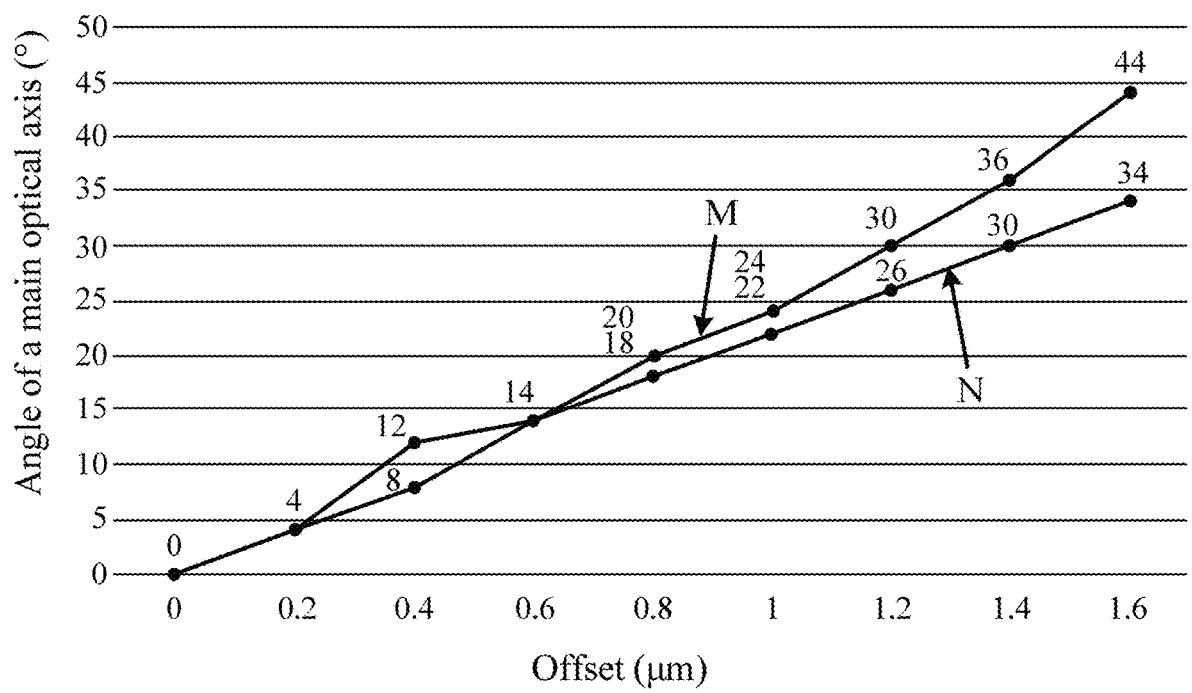
FIG. 8 plots curves illustrating those angles of main optical axes vary with offsets according to embodiments of the present disclosure.

Additionally, FIG. 8 plots curves illustrating those angles of main optical axes vary with offsets according to embodiments of the present disclosure. Curve M illustrates that the angles of the main optical axes vary with offsets, the curve M is obtained by testing the display panel of FIG. 3. Curve N illustrates that the angles of the main optical axes vary with offsets, the curve N is obtained by testing the display panel of FIG. 4. Specifically, in curve M, an offset refers to a displacement in the direction facing away from the geometric center of the display region by which a color filter is offset relative to a light-emitting element. In curve N, an offset refers to a displacement in the direction facing away from the geometric center of the display region by which a color filter and a micro-lens are offset relative to a light-emitting element. In curve M and curve N, the angle of a main optical axis is an angle at which a main optical axis deviates from the first direction. The first direction is perpendicular to the plane in which the display panel is located.

Figure 9:
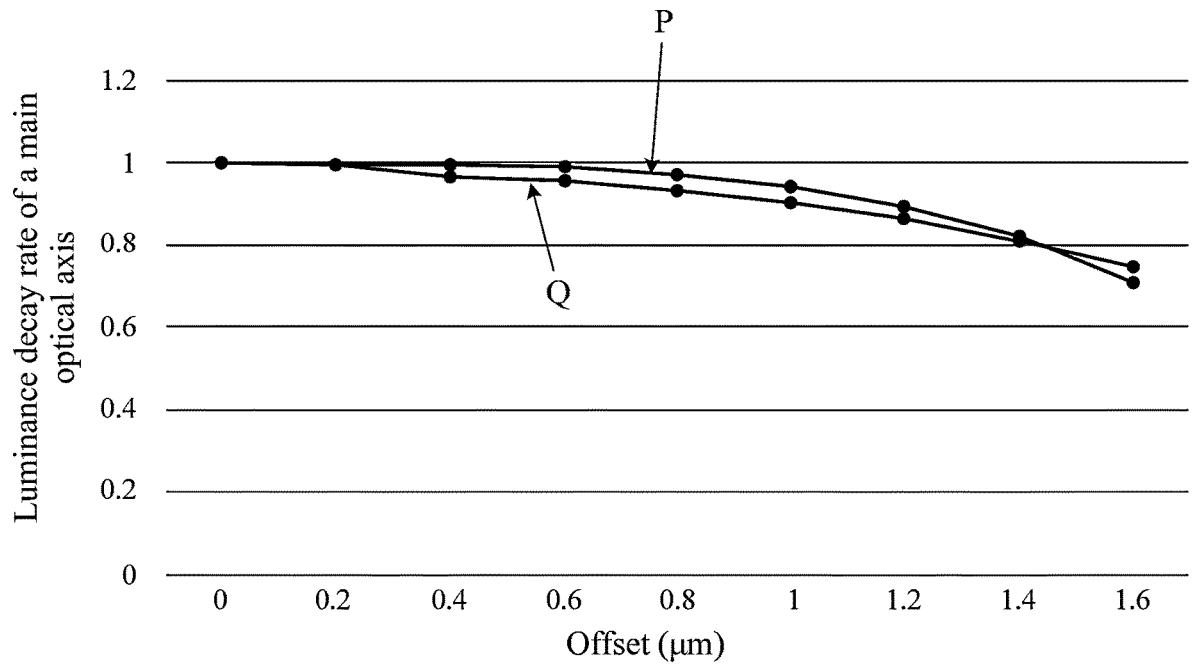
FIG. 9 plots curves illustrating that the luminance of main optical axes varies with offsets according to embodiments of the present disclosure.

FIG. 9 plots curves illustrating that the luminance of main optical axes varies with offsets according to embodiments of the present disclosure. Curve R illustrates that the luminance of the main optical axes varies with offsets, and the curve R is obtained by testing the display panel of FIG. 3. Curve S illustrates that the luminance of the main optical axes varies with offsets, and the curve S is obtained by testing the display panel of FIG. 4. As shown in FIG. 9, as the offsets increase, the luminance of the main optical axes decreases.

Figure 10:
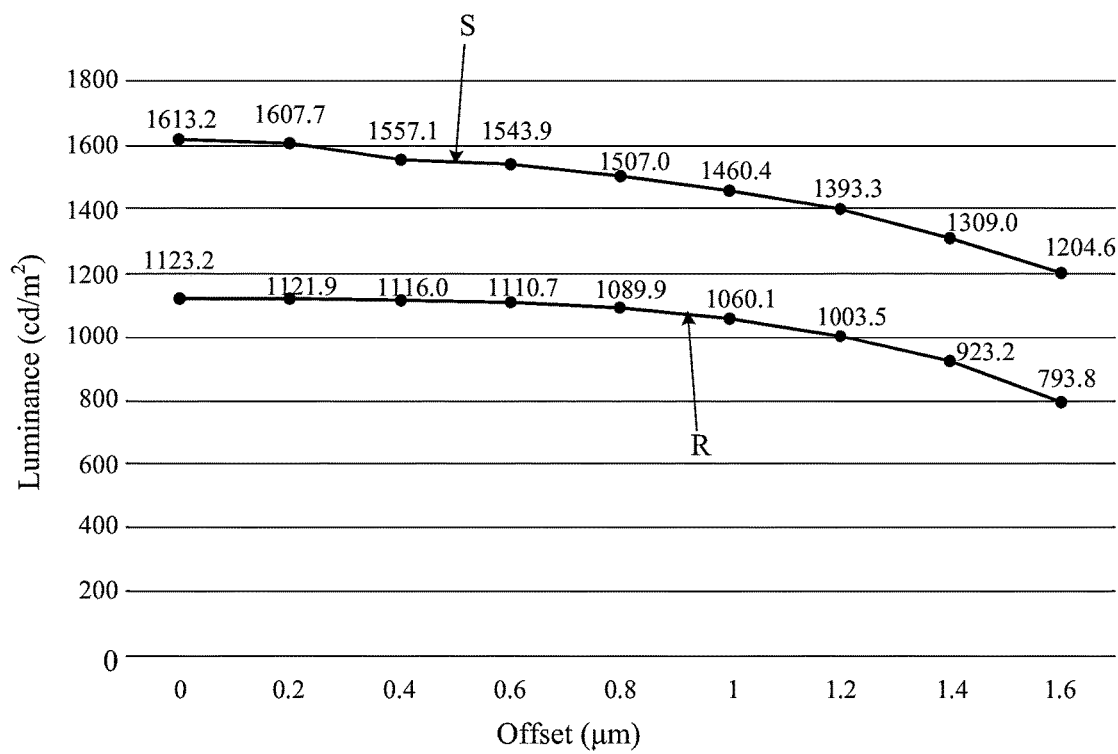
FIG. 10 plots curves illustrating that luminance decay ratios of main optical axes vary with offsets according to embodiments of the present disclosure.

Table 2 describes the relations between luminance decay ratios of main optical axes and offsets. A decay ratio 1 is a luminance decay ratio of a main optical axis at different offsets obtained by testing the display panel of FIG. 3. A decay ratio 2 is a luminance decay ratio of a main optical axis at different offsets obtained by testing the display panel of FIG. 4. Correspondingly, FIG. 10 plots a curve illustrating that luminance decay ratios of main optical axes vary with offsets according to embodiments of the present disclosure. Curve P illustrates that the luminance decay ratios of the main optical axes vary with offsets, the curve P being obtained by testing the display panel of FIG. 3. Curve Q illustrates that the luminance decay ratios of the main optical axes vary with offsets, the curve Q being obtained by testing the display panel of FIG. 4. Specifically, the luminance decay ratio of a main optical axis is a percentage that the luminance of the main optical axis occupies amid the luminance at the center of the display panel.

|  | 0 | 0.2 | 0.4 | 0.6 | 0.8 | 1.0 | 1.2 | 1.4 | 1.6 |
|---|---|---|---|---|---|---|---|---|---|
| Decay ratio 1 | 100% | 99.88% | 99.36% | 98.88% | 97.04% | 94.39% | 89.34% | 82.20% | 70.67% |
| Decay ratio 2 | 100% | 99.66% | 96.52% | 95.70% | 93.42% | 90.52% | 86.74% | 81.14% | 74.67% |

The basic indexes of the display panel are that the luminance decay ratio of the main optical axis with the lowest luminance is larger than 80% and that the angle of the main optical axis is about 46°. Referring to Table 2 and FIG. 10, when the offsets are lower than or equal to 1.4, the luminance decay ratios of the main optical axes meet the requirement. On this basis, still referring to FIG. 8, when the offsets are 1.4, the largest angle of the main optical axes is merely 36°, unable to meet the requirement for the angles of the main optical axes in the basic indexes. Accordingly, the luminance of the regions with greater offsets needs to be increased so that both the angles of the main optical axes and the luminance of the main optical axes meet the requirement of the basic indexes.

According to the preceding condition, embodiments of the present disclosure provide a display panel to increase the luminance of the main optical axes with relatively large angles so that both the angles of the main optical axes and the luminance of the main optical axes meet the requirement of the basic indexes. Moreover, the gradually decreasing luminance from the center to the edges of the display panel is made up for, and the luminance uniformity of the display panel is promoted.

Figure 11:
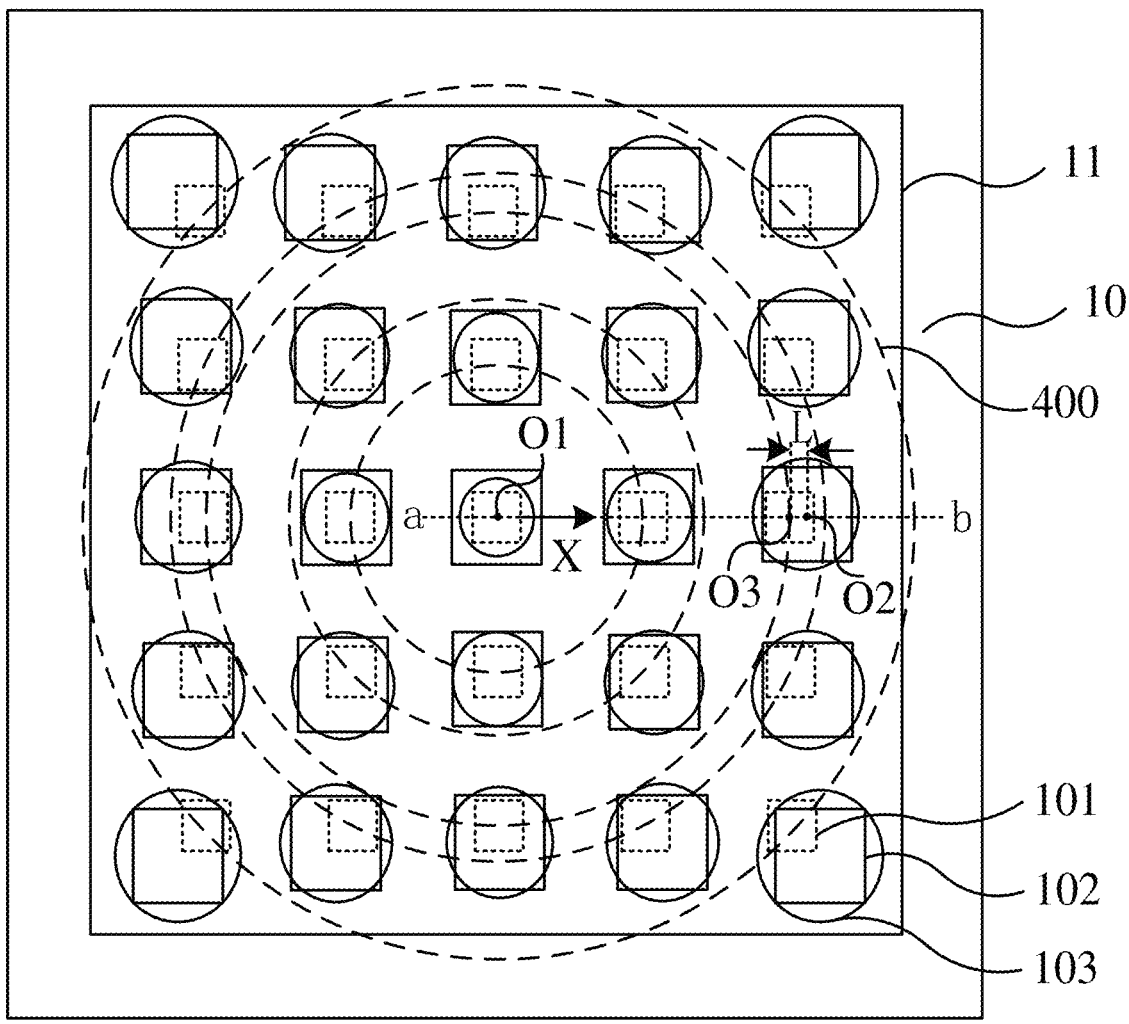
FIG. 11 is a diagram illustrating the structure of a display panel according to embodiments of the present disclosure.
Figure 12:
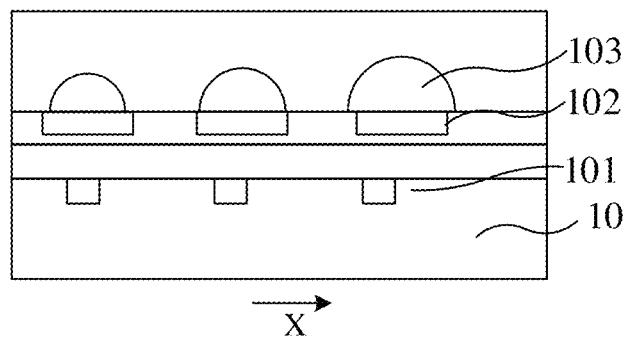
FIG. 12 is a sectional view taken along dashed line AB of FIG. 11.

Specifically, FIG. 11 is a diagram illustrating the structure of a display panel according to embodiments of the present disclosure. FIG. 12 is a sectional view taken along dashed line AB of FIG. 11. As shown in FIGS. 11 and 12, the display panel includes a substrate 10, a plurality of light-emitting elements 101, a plurality of color filters 102, and a plurality of micro-lenses 103 formed on the substrate 10 ordinally.

The color filters 102 are in one-to-one correspondence with the light-emitting elements 101. Each color filter 102 is disposed on the light extraction side of a respective light-emitting element 101 corresponding to the color filter 102. The micro-lenses 103 are in one-to-one correspondence with the color filters 102. Each micro-lens 103 is disposed on one side of a respective color filter 102 corresponding to the micro-lens 103 facing away from the light-emitting elements 101. A line connecting the geometric center (not shown) of the micro-lens 103 and the geometric center O2 of the color filter 102 corresponding to the micro-lens 103 is perpendicular to the plane in which the substrate 10 is located.

The display panel includes a display region 11. The light-emitting elements 101 are disposed in the display region 11. The geometric center of the display region 11 is configured as a first center O1. Circles centered at the first center O1 are configured as first circles 400. Along a direction in which a radius of any one of the first circles 400 points away from the first center O1, in the direction facing away from the first center O1, the offsets L of the geometric centers O2 of multiple color filters 102 relative to the light-emitting centers O3 of multiple light-emitting elements 101 increase gradually, and the volumes of multiple micro-lenses 103 increase gradually.

Still referring to FIG. 8, as the offsets increase, the angles of the main optical axes increase. Accordingly, along a direction X in which a radius of any one of the first circles 400 points away from the first center O1, the offsets L of the geometric centers O2 of multiple color filters 102 relative to the light-emitting centers O3 of multiple light-emitting elements 101 are set to increase gradually. With this arrangement, the light emitted from the display panel is in a divergent state, and all the light beams emitted from various angles may be collected by the optical lens.

Figure 13:
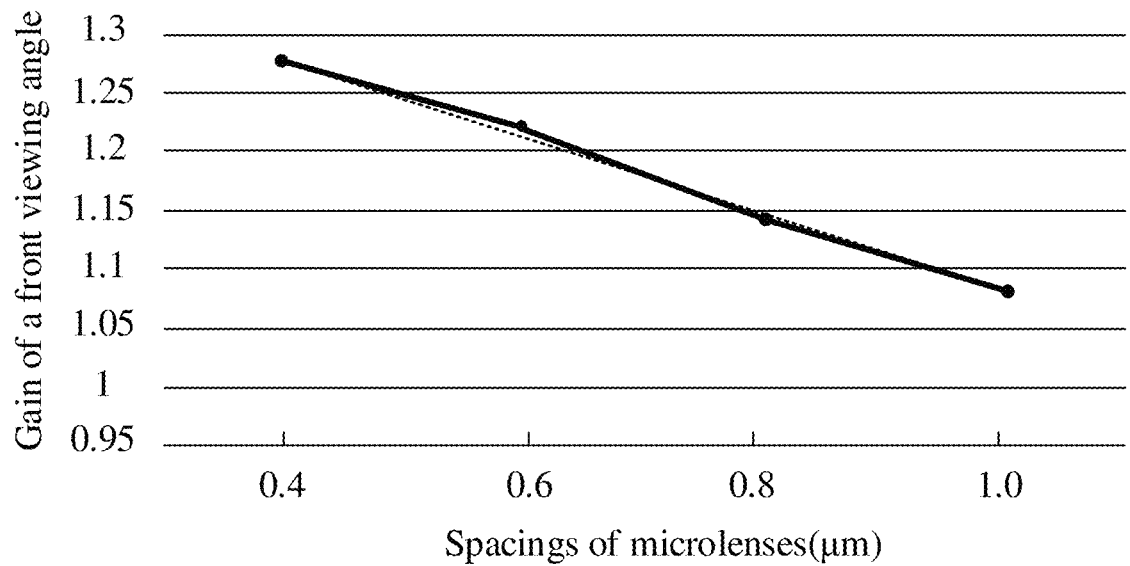
FIG. 13 plots a curve illustrating that the gain of a front viewing angle varies with spacings of the micro-lenses according to embodiments of the present disclosure.

FIG. 13 plots a curve illustrating that the gain of a front viewing angle varies with spacings of the micro-lenses according to embodiments of the present disclosure. It is to be noted that the available area for each micro-lens in the display panel is equal and is the total area of the display panel divided by the total number of micro-lenses. In the case where the volumes of the micro-lenses are decreased by decreasing the base areas and heights of the micro-lenses, the spacings of the micro-lenses are increased. The relevant data in FIG. 13 is obtained on this basis. It is to be understood that increasing spacings of the micro-lenses indicate decreasing volumes of the micro-lenses. As shown in FIG. 13, as spacings of the micro-lenses increase, that is, as the volumes of the micro-lenses decrease, the gain of a front viewing angle decreases, indicating that the luminance decreases. It can be seen that the luminance may be increased by increasing the volumes of the micro-lenses. Accordingly, the volumes of the micro-lenses are set to increase gradually along the direction in which a radius of any one of the first circles points away from the first center, thus compensating for the original luminance that decreases gradually and improving the luminance uniformity of the display panel.

It is to be noted that, the following relationship is obtained with a gain of the front viewing angle as the dependent variable and a spacing of the micro-lenses as the variable based on FIG. 13: y=−0.067 x+1.3478. It is to be noted that the coefficients of the preceding relationship are related to parameters such as the distance between a light-emitting element and a micro-lens, the refractive index of a micro-lens, a refractive index of the glue layer above the micro-lens, and the thicknesses and refractive indexes of different layers in the display device. Accordingly, the coefficients of the preceding relationship obtained by testing different display devices are different. However, the trend is the same. That is, as the volumes of the micro-lenses decrease, the gain of the front viewing angle decreases.

The geometric center of the display region of the display panel provided in embodiments of the present disclosure is the first center. Circles centered at the first center are configured as first circles. Along a direction in which a radius of any one of the first circles points away from the first center, the offsets of the geometric centers of multiple color filters relative to the light-emitting centers of multiple light-emitting elements increase gradually, and the volumes of multiple micro-lenses increase gradually. With this arrangement, along the direction in which a radius of any one of the first circles points away from the first center, the effect of increasing luminance strengthens gradually, thus compensating for the luminance difference in the direction, improving the luminance uniformity in the display region of the display device, and ensuring the angles and luminance of the main optical axes to meet the requirement of the basic indexes.

Still referring to FIG. 11, the offsets L of the color filters 102 corresponding to the light-emitting elements 101 whose light-emitting centers O3 are disposed at the same first circle 400 are equal to each other, and the volumes of the micro-lenses 103 corresponding to the light-emitting elements 101 whose light-emitting centers O3 are disposed at the same first circle 400 are equal to each other.

It is to be noted that the angles of the main optical axes are related to the offsets L of the color filters 102 and the micro-lenses 103 and the volumes of the micro-lenses 03. The luminance of the main optical axes are related to the volumes of the micro-lenses 03. The configuration in which the offsets L of the color filters 102 corresponding to the light-emitting elements 101 whose light-emitting centers O3 are disposed at the same first circle 400 are equal to each other and in which the volumes of the micro-lenses 103 corresponding to the light-emitting elements 101 whose light-emitting centers O3 are disposed at the same first circle 400 are equal to each other enables the main optical axes disposed at the same first circle 400 to have the same angles and the same luminance. This configuration facilitates the luminance adjustment by adjusting the volumes of the micro-lenses 103 at the same first circle 400 and may improve the luminance uniformity of the display panel.

Exemplarily, along the direction X in which a radius of any one of the first circles 400 points away from the first center O1, the differences between the offsets L of any adjacent color filters 102 are equal to each other.

Still referring to FIG. 8, it is to be noted that the angles of the main optical axes are almost linearly correlated with the offsets. In the arrangement, along the direction X in which a radius of any one of the first circles 400 points away from the first center O1, the differences between the offsets L of any two adjacent color filters 102 are equal to each other. This arrangement enables the differences between the angles of the main optical axes corresponding to the two adjacent color filters 102 to be equal to each other, and thus enables the main optical axes emitted from various regions of the display panel to be incident to the center of the corresponding optical lens.

Optionally, along the direction X in which a radius of any one of the first circles 400 points away from the first center O1, the differences between the volumes of two adjacent micro-lenses 103 increase gradually.

Still referring to FIG. 9, it is to be noted that the greater an offset, the greater the variation of the luminance of the main optical axes under the same offset. Still referring to FIG. 13, the gains of the front viewing angle are almost linearly correlated with the spacings of the micro-lenses, and the gains of the front viewing angle are almost linearly correlated with the volumes of the micro-lenses accordingly. In this manner, to enable the increment of the volumes of the micro-lenses to effectively compensate for the decrease in the luminance of the main optical axes along with the offsets, the differences between the volumes of two adjacent micro-lenses are set to increase gradually along the direction in which a radius of any one of the first circles points away from the first center.

Still referring to FIGS. 11 and 12, along the direction X in which a radius of any one of the first circles 400 points away from the first center O1, both the heights and the base areas of the micro-lenses 103 increase gradually.

In this manner, a relative large variation in the volumes of the micro-lenses is realized in the condition of relative small variations in heights and base areas, preventing a large numerical span in heights or base areas from causing an increase in space occupation.

Figure 14:
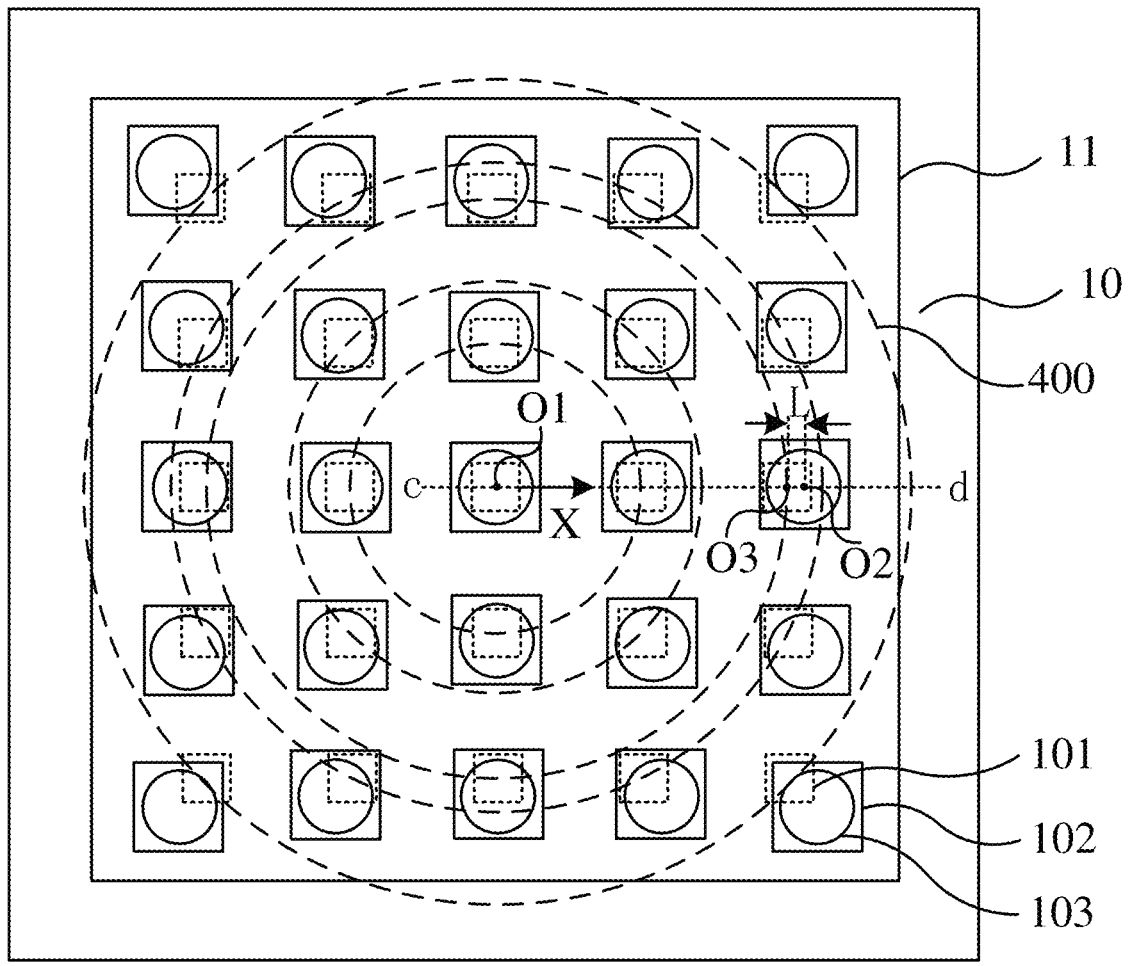
FIG. 14 is a diagram illustrating the structure of another display panel according to embodiments of the present disclosure.
Figure 15:
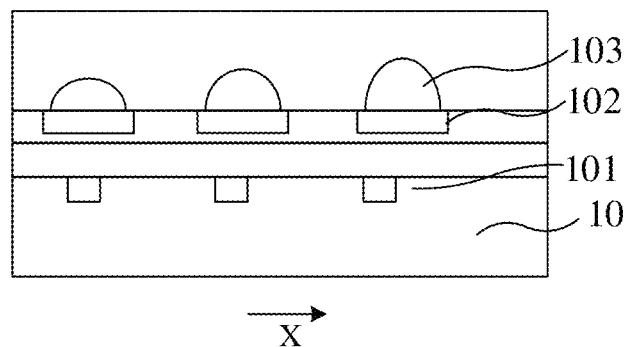
FIG. 15 is a sectional view taken along a dashed line CD of FIG. 14.

FIG. 14 is a diagram illustrating the structure of another display panel according to embodiments of the present disclosure. FIG. 15 is a sectional view taken along dashed line cd of FIG. 14. As shown in FIGS. 14 and 15, along the direction X in which a radius of any one of the first circles 400 points away from the first center O1, the base areas of the micro-lenses 103 are equal to each other, and the heights of the micro-lenses 103 increase gradually.

Figure 16:
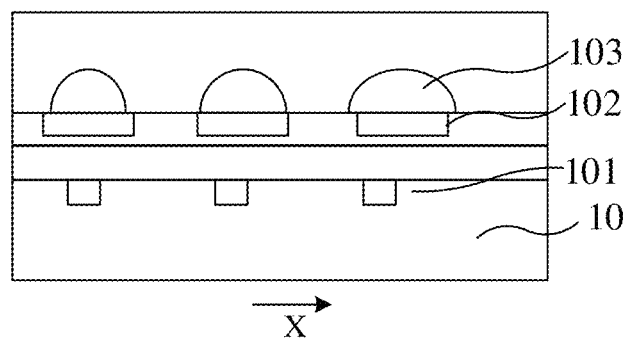
FIG. 16 is another sectional view taken along a dashed line AB of FIG. 11.

In other implementations of this embodiment, FIG. 16 is another sectional view taken along dashed line ab of FIG. 11. As shown in FIG. 16, along the direction X in which a radius of any one of the first circles 400 points away from the first center O1, the heights of the micro-lenses 103 are equal, and the base areas of the micro-lenses 103 increase gradually.

It is to be noted that the volumes of the micro-lenses in FIGS. 15 and 16 are set in the condition of a single variable. In FIG. 15, the single variable is the heights of the micro-lenses. In FIG. 16, the single variable is the base areas of the micro-lenses. In this manner, according to the relationship between a single variable and the volumes of the micro-lenses, the volumes of micro-lenses may be adjusted only by changing the single variable, which reduces the difficulty in design.

Optionally, a micro-lens is in a shape of a semi-ellipsoid, hemisphere, or spherical crown with a circular or elliptical base.

In this manner, micro-lenses may be prepared directly in the display panel through a low-temperature process, preventing the performance of other components in the display panel from being affected by an excessively high process temperature.

It is to be understood that the attachable micro-lenses may be prepared through other processes and then attached to the corresponding positions in the display panel. In this case, there is no requirement for a low temperature in the preparation process of the micro-lenses, and the micro-lenses may be formed into other shapes not limited to the preceding semi-ellipsoid, hemisphere, or spherical crown with a circular or elliptical base.

It is to be noted that the shape of the color filters may be the same as or different from the shape of the bases of the micro-lenses. Exemplarily, the color filters may be in a square, rectangular, rhombic, hexagonal, or octagonal shape. The area of a color filter is larger than the area of a light-emitting element.

Exemplarily, the light-emitting elements may be micro-OLEDs.

It is to be noted that the micro-organic light-emitting diodes (micro-OLEDs) have the advantages of small volume, high luminance, and low power consumption, thus helping reduce pixel areas and enhance the pixel intensity of the display panel.

Optionally, the light-emitting elements include a plurality of first light-emitting elements, a plurality of second light-emitting elements, and a plurality of third light-emitting elements. The color of the first light-emitting elements, the color of the second light-emitting elements, and the color of the third light-emitting elements are each any one of red, green, or blue and are different from each other.

It is to be noted that red, green, and blue are three primary colors of light. Light of various colors is obtained by mixing red, green, and blue that are of different intensities. Accordingly, the color of the first light-emitting elements, the color of the second light-emitting elements, and the color of the third light-emitting elements are each any one of red, green, or blue and are different from each other, which diversifies and enriches the display colors of the display panel. Additionally, the scope of the present disclosure is not limited to the three types of light-emitting elements of red, green, and blue. The present disclosure only takes the three light-emitting elements of red, green, and blue as examples of specific implementations for description. The light-emitting elements in the present disclosure may be four types of light-emitting elements of red, green, blue, and white (RGBW). Alternatively, the light-emitting elements in the present disclosure may be four types of light-emitting elements of red, green, blue, and yellow (RGBY). Alternatively, the light-emitting elements in the present disclosure may be three types of light-emitting elements rendered and arranged through sub-pixels of red, green, blue, and green (RGBG). The scope of the present disclosure is not limited by the preceding examples as long as the arrangement of the light-emitting elements, the color filters, and the micro-lenses conform to the technical ideas of the present disclosure.

Figure 17:
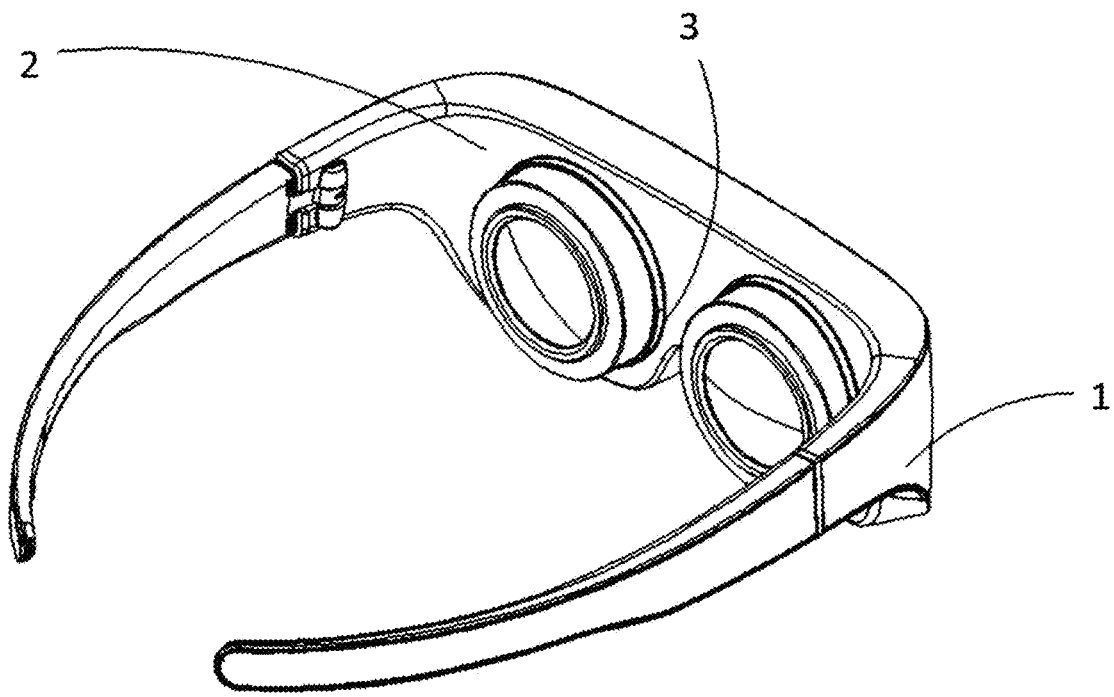
FIG. 17 is a diagram illustrating the structure of a display device according to embodiments of the present disclosure.

FIG. 17 is a diagram illustrating the structure of a display device according to embodiments of the present disclosure. The display device is a near-eye display device and may be a virtual-reality display device or an augmented-reality display device. A near-eye display device 1 includes a frame 2 and a display panel 3 disposed in the frame 2. The display panel 3 is a display panel provided in any embodiment of the present disclosure. The near-eye display device 1 further includes an optical lens disposed opposite to the display panel. The display device of the present disclosure may be a display device used for other types and not limited in the present disclosure.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising: a substrate, a plurality of light-emitting elements disposed on the substrate, a plurality of color filters on the substrate, and a plurality of micro-lenses disposed on the substrate;

upon each light-emitting element are stacked sequentially a corresponding color filter and a corresponding micro-lens, and a line connecting a geometric center of one micro-lens and a geometric center of one color filter corresponding to the one micro-lens is perpendicular to a plane in which the substrate is located; and the display panel comprises a display region, wherein the plurality of light-emitting elements are disposed in the display region, a geometric center of the display region is configured as a first center, and circles centered at the first center are configured as first circles; and wherein the geometric center of the display region is offset by a gradually increasing distance from the geometric centers of the plurality of color filters relative to light-emitting centers of the plurality of light-emitting elements, and volumes of multiple micro-lenses increase gradually.

2. The display panel of claim 1, wherein for light-emitting elements whose light-emitting centers are disposed in a same first circle, offsets of geometric centers of color filters corresponding to the light-emitting elements relative to light-emitting centers of the light-emitting elements are equal to each other.

3. The display panel of claim 1, wherein along a direction in which a radius of any one of the first circles points away from the first center, differences between offsets of any two adjacent color filters among the plurality of color filters are equal to each other.

4. The display panel of claim 1, wherein along a direction in which a radius of any one of the first circles points away from the first center, differences between volumes of any two adjacent micro-lenses among the plurality of micro-lenses increase gradually.

5. The display panel of claim 1, wherein along a direction in which a radius of any one of the first circles points away from the first center, base areas of the plurality of micro-lenses are equal to each other, and heights of the plurality of micro-lenses increase gradually.

6. The display panel of claim 1, wherein along a direction in which a radius of any one of the first circles points away from the first center, heights of the plurality of micro-lenses are equal to each other, and base areas of the plurality of micro-lenses increase gradually.

7. The display panel of claim 1, wherein along a direction in which a radius of any one of the first circles points away from the first center, heights of the plurality of micro-lenses increase gradually, and base areas of the plurality of micro-lenses increase gradually.

8. The display panel of claim 1, wherein the one micro-lens is in a shape of a semi-ellipsoid, hemisphere, or spherical crown with a circular or elliptical base.

9. The display panel of claim 1, wherein the plurality of light-emitting elements are micro-OLEDs.

10. The display panel of claim 1, wherein the plurality of light-emitting elements comprise a plurality of first light-emitting elements, a plurality of second light-emitting elements, and a plurality of third light-emitting elements; and a color of the plurality of first light-emitting elements, a color of the plurality of second light-emitting elements, and a color of the plurality of third light-emitting elements are each any one of red, green, or blue and are different from each other.

11. A display device, comprising a display panel, wherein the display panel comprises: a substrate, a plurality of light-emitting elements disposed on the substrate, a plurality of color filters on the substrate, and a plurality of micro-lenses disposed on the substrate;

upon each light-emitting element are stacked sequentially a corresponding color filter and a corresponding micro-lens, and a line connecting a geometric center of one micro-lens and a geometric center of one color filter corresponding to the one micro-lens is perpendicular to a plane in which the substrate is located; and the display panel comprises a display region, wherein the plurality of light-emitting elements are disposed in the display region, a geometric center of the display region is configured as a first center, and circles centered at the first center are configured as first circles; and wherein the geometric center of the display region is being offsets by a gradually increasing distance from the geometric centers of the plurality of color filters relative to light-emitting centers of the plurality of light-emitting elements, and volumes of multiple micro-lenses increase gradually.

* * * * *